(12) United States Patent
Anderson et al.

(10) Patent No.: US 8,963,577 B2
(45) Date of Patent: Feb. 24, 2015

(54) TERMINATION IMPEDANCE APPARATUS WITH CALIBRATION CIRCUIT AND METHOD THEREFOR

(71) Applicant: Advanced Micro Devices, Inc., Sunnyvale, CA (US)

(72) Inventors: Warren R. Anderson, Westborough, MA (US); Shyam S. Sivakumar, Mountain View, CA (US); Austen J. Hypher, Cambridge, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 13/869,473

(22) Filed: Apr. 24, 2013

(65) Prior Publication Data

US 2014/0325135 A1    Oct. 30, 2014

(51) Int. Cl.
*H03K 17/16* (2006.01)
*H03K 19/003* (2006.01)
*H03K 19/00* (2006.01)
*G11C 7/10* (2006.01)

(52) U.S. Cl.
CPC .......... *H03K 19/0005* (2013.01); *G11C 7/1072* (2013.01)
USPC ............. 326/30; 326/33; 326/34; 326/87

(58) Field of Classification Search
USPC .................................................. 326/30
See application file for complete search history.

(56) References Cited

U.S. PATENT DOCUMENTS

| 6,541,996 B1 | 4/2003 | Rosefield et al. | |
| 2004/0217774 A1* | 11/2004 | Choe | 326/30 |
| 2007/0063731 A1* | 3/2007 | Kuroki | 326/30 |
| 2011/0074520 A1* | 3/2011 | Tyan et al. | 333/32 |

\* cited by examiner

*Primary Examiner* — Anh Tran
(74) *Attorney, Agent, or Firm* — Polansky & Associates, P.L.L.C.; Paul J. Polansky

(57) ABSTRACT

A termination impedance apparatus includes a variable pull-up resistor, a variable pull-down resistor, and a small-signal calibration circuit. The variable pull-up resistor is coupled between a first power supply voltage terminal and an output terminal. The variable pull-down resistor is coupled between the output terminal and a second power supply voltage terminal. The small-signal calibration circuit is for calibrating the variable pull-up resistor and the variable pull-down resistor to achieve a desired small-signal impedance.

30 Claims, 7 Drawing Sheets

US 8,963,577 B2

TERMINATION IMPEDANCE APPARATUS WITH CALIBRATION CIRCUIT AND METHOD THEREFOR

FIELD

This disclosure relates generally to input and/or output (I/O) circuits, and more specifically to circuits and methods for calibrating the termination impedance of I/O circuits.

BACKGROUND

Semiconductor devices include input and/or output (I/O) circuits to provide internal signals to an external communication channel and/or to receive signals from the external communication channel. High speed communication systems such as Gunning transceiver logic (GTL), stub series terminated logic (SSTL), and high-speed transceiver logic (HSTL) keep the channel voltage swing small to reduce transmission delay. This reduction in channel voltage swing increases the susceptibility to noise and signal reflection due to termination impedance mismatch. In order to match termination impedances better, some integrated circuits use calibration circuits to match on-chip termination impedances to off-chip precision resistors. However the combination of transistor and resistor elements used to form the on-chip termination impedances in complementary metal-oxide-semiconductor (CMOS) manufacturing processes have some degree of non-linearity, making accurate matching difficult.

Figure 1:
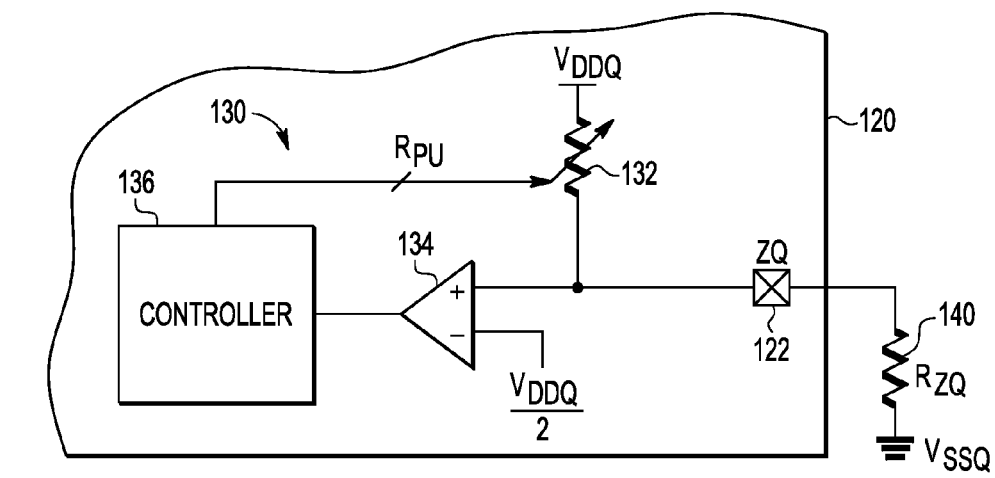
FIG. 1 illustrates in partial block diagram and partial schematic form a calibration circuit implementing a first step in a large-signal impedance matching method known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Known impedance matching circuits use calibration methods that calibrate large-signal impedance using termination circuits that are largely resistor-dominated networks, adjusting the effective impedance using transistors as the mechanism to switch in and out parallel resistors. As a consequence, impedance matching errors are introduced due to the non-linear nature of the transistors. According to some embodiments, a termination impedance apparatus includes a small-signal calibration circuit to calibrate a variable pull-up resistor and a variable pull-down resistor over a small-signal voltage swing. The calibration values of the termination resistors of this system more accurately reflect the behavior of the termination resistances under the switching conditions that will actually be encountered. This termination impedance apparatus is useful in a variety of integrated circuits such as data processors and integrated circuit memories.

FIG. 1 illustrates in partial block diagram and partial schematic form a calibration circuit 100 implementing a first step in a large-signal impedance matching method known in the prior art. Calibration circuit 100 generally includes an on-chip calibration circuit 130 on a portion of an integrated circuit 120 operatively connected to an external calibration resistor 140 having a resistance labeled "$R_{ZQ}$" by way of input/output terminal 122 labeled "ZQ". On-chip calibration circuit 130 generally includes a variable pull-up resistor 132, a comparator 134, and a controller 136. Resistor 132 has a first terminal connected to a more-positive power supply voltage labeled "$V_{DDQ}$" having a nominal voltage of, for example 1.5 volts, a second terminal connected to input/output terminal 122, and a control terminal. Comparator 134 has a non-inverting input terminal connected to input/output terminal 122, an inverting input terminal for receiving a voltage labeled "$V_{DDQ}/2$", and an output terminal. Controller 136 has an input terminal connected to the output terminal of comparator 134, and an output connected to the control terminal of variable pull-up resistor 132 for providing a multiple bit signal labeled "$R_{PU}$". External calibration resistor 140 has a first terminal connected to input/output terminal 122, and a second terminal connected to a more-negative power supply voltage terminal labeled "$V_{SSQ}$" having a nominal voltage of, for example, 0 volts.

In operation, resistor 132 is connected in series with external calibration resistor 140 via input/output terminal 122 between $V_{DDQ}$ and $V_{SSQ}$. The voltage of input/output terminal 122 is determined through voltage division of external calibration resistor 140 and resistor 132. One input of comparator 134 is operatively connected to input/output terminal 122 and compares the voltage of input/output terminal 122 against $V_{DDQ}/2$. $V_{DDQ}/2$ may be an internally or externally generated voltage. Comparator 134 generates, in response to this comparison, an output voltage to the input of controller 136 having a logic state indicating whether the voltage of input/output terminal 122 is higher or lower than $V_{DDQ}/2$. In response to this output voltage from comparator 134, controller 136 generates signal $R_{PU}$. Variable pull-up resistor 132 is typically formed by multiple parallel resistors that are selectively turned on or off in response to $R_{PU}$, thus adjusting the resistance value of variable pull-up resistor 132 in discrete steps. Adjustment continues until the voltage of input/output terminal 122 is approximately equal to $V_{DDQ}/2$, thereby causing the resistance of the variable pull-up resistor 132 to be approximately equal to that of the external calibration resistor 140, $R_{ZQ}$.

Figure 2:
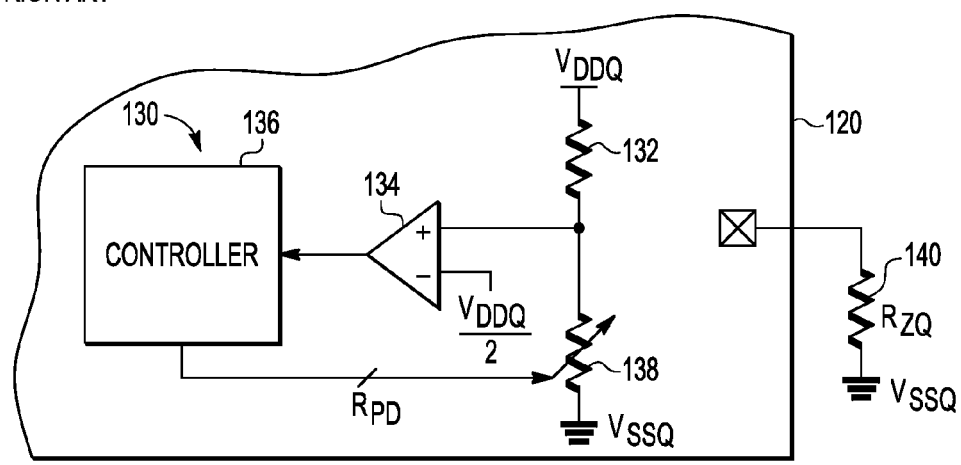
FIG. 2 illustrates in partial block diagram and partial schematic form the large-signal calibration circuit of FIG. 1 implementing a second step in a large-signal impedance matching method known in the prior art.

FIG. 2 illustrates in partial block diagram and partial schematic form the large-signal calibration circuit of FIG. 1 implementing a second step in a large-signal impedance matching method known in the prior art. In this configuration, the resistance of variable pull-up resistor 132 has been set with a value of $R_{PU}$ determined as described above, and a variable pull-down resistor 138 is connected to the second terminal of variable pull-up resistor 132. Thus, the voltage of the calibration node is now determined through voltage division of variable pull-up resistor 132 calibrated as described above and variable pull-down resistor 138. As described above, one input of comparator 134 is operatively connected to the calibration node between variable pull-up resistor 132 and variable pull-down resistor 138 and again compares the voltage of the calibration node against $V_{DDQ}/2$. Comparator 134 again generates, in response to this comparison, an output voltage on its output terminal having a logic state that indicates whether the voltage on the calibration node is higher or lower than $V_{DDQ}/2$. In response to this output voltage from comparator 134, controller 136 generates a signal labeled "$R_{PD}$". Variable pull-down resistor 138 is typically configured with a plurality of parallel resistors that are selectively turned on or off in response to calibration code $R_{PD}$, thus adjusting the resistance value of variable pull-down resistor 138. Again, adjustment continues until the voltage of the calibration node is substantially equal to $V_{DDQ}/2$, thereby causing the resistance of the variable pull-down resistor 138 to be approximately equal to that of the variable pull-up resistor 132, which itself is approximately equal to that of the external resistor 140, $R_{ZQ}$.

Figure 3:
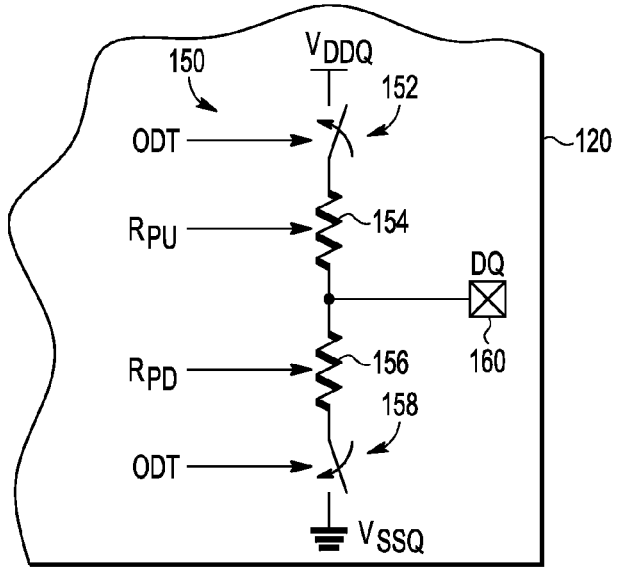
FIG. 3 illustrates in schematic form a conventional termination circuit known in the prior art.

FIG. 3 illustrates in schematic form a termination circuit 150 known in the prior art. Termination circuit 150 is also implemented on a portion of integrated circuit 120 and includes in input/output terminal labeled "DQ" 160, a switch 152, a variable pull-up termination resistor 154, a variable pull-down termination resistor 156, and a switch 158. Switch 152 has a first terminal connected to $V_{DDQ}$, a second terminal and a control terminal for receiving a control signal labeled "ODT". Termination resistor 154 has a first terminal connected to the second terminal of switch 152, a second terminal connected to input/output terminal 160, and has a resistance determined by signal $R_{PU}$. Termination resistor 156 has a first terminal connected to the second terminal of termination resistor 154, a second terminal, and has a resistance determined by signal $R_{PD}$. Switch 158 has a first terminal connected to the second terminal of termination resistor 156, a second terminal connected to $V_{SSQ}$, and a control terminal for receiving control signal ODT.

During times in which on-die termination is needed, control circuitry on integrated circuit 120 (not shown in FIG. 3) activates signal ODT, closing switches 152 and 158. Termination resistors 154 and 156 have sizes matched or scaled proportionally to variable pull-up resistor 132 and variable pull-down resistor 138, respectively, and have discrete sections switched by signals $R_{PU}$ and $R_{PD}$. However the discrete sections of termination resistors 154 and 156 are switched by MOS transistors which themselves operate as nonlinear resistors. Thus the additional resistance introduced by the switches varies according to the voltage across the switches. Thus the values of signals $R_{PU}$ and $R_{PD}$ do not accurately cause the values of resistors 154 and 156 to match external precision resistor 140 over the small-signal range. For example, the small-signal range is typically 0.4 times $V_{DDQ}$ to 0.6 times $V_{DDQ}$, or 0.6 volts to 0.9 volts for $V_{DDQ}$ of 1.5 volts for terminated input signals. Deviations between the large-signal and small-signal resistances can cause large reflections, degrading the resulting input signal.

Figure 4:
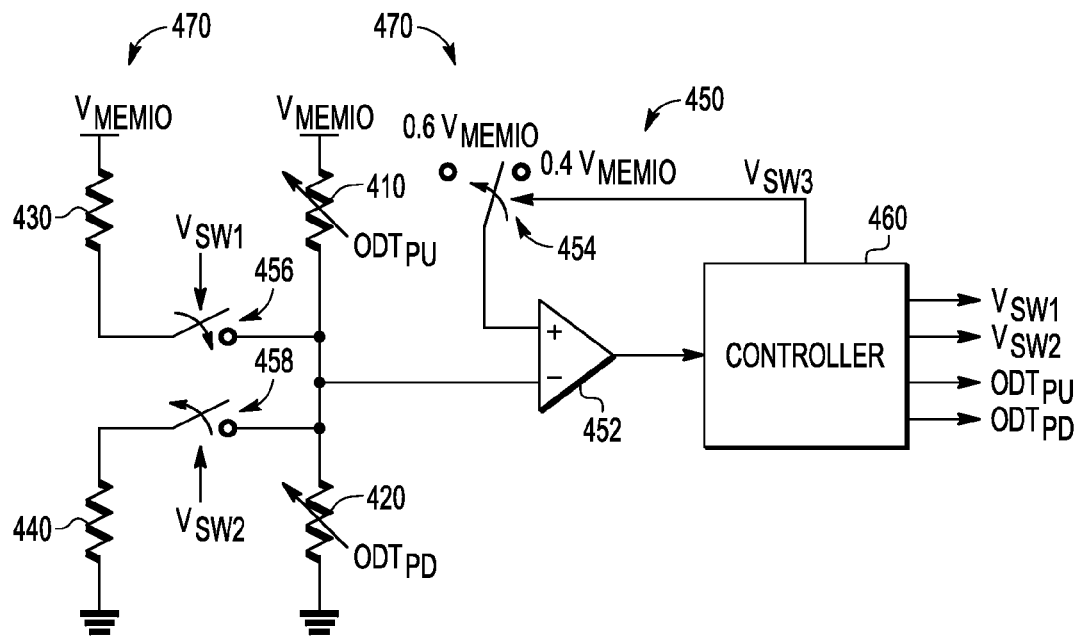
FIG. 4 illustrates in partial block diagram and partial schematic form a termination impedance apparatus having small-signal calibration capability according to some embodiments.

FIG. 4 illustrates in block diagram form a termination impedance apparatus 400 having small-signal calibration capability according to some embodiments. Termination impedance apparatus 400 generally includes variable pull-up resistor 410, variable pull-down resistor 420, and a small-signal calibration circuit 470.

Variable pull-up resistor 410 has a first terminal connected to a power supply voltage terminal labeled "$V_{MEMIO}$", a second terminal, and a control terminal for receiving a control signal from controller 460 labeled "$ODT_{PU}$". Variable pull-down resistor 420 has a first terminal connected to the second terminal of variable pull-up resistor 410, a second terminal connected to ground, and a control terminal for receiving a signal labeled "$ODT_{PD}$".

Small-signal calibration circuit 470 generally includes a reference resistor 430, a reference resistor 440, and a control circuit 450. Thus in the embodiment shown in FIG. 4, small-signal calibration circuit 470 includes a portion to the left of resistors 410 and 420, and another portion to the right of resistors 410 and 420, both of which collectively form small-signal calibration circuit 470. Reference resistor 430 has a first terminal connected to $V_{MEMIO}$, and a second terminal. Reference resistor 440 has a first terminal, and a second terminal connected to ground. Control circuit 450 generally includes a comparator 452, switches 454, 456, and 458, and a controller 460 Comparator 452 has a positive input terminal a negative input terminal connected to the second terminal of reference resistor 430, and an output terminal. Switch 454 has a first terminal, and a second terminal selectively switched between a first node having a voltage equal to $0.6V_{MEMIO}$ and a second node having a voltage equal to $0.4V_{MEMIO}$. Switch 456 has a first terminal connected to the second terminal of reference resistor 430, and a second terminal connected to the second terminal of variable pull-up resistor 410, and is opened and closed by a labeled "$V_{SW1}$". Switch 458 has a first terminal connected to the second terminal of reference resistor 440, and a second terminal connected to the second terminal of variable pull-down resistor 420, and is opened and closed by a labeled "$V_{SW2}$". Controller has an input terminal connected to the output terminal of comparator 452, and output terminals for providing signals "$V_{SW1}$, $V_{SW2}$, $V_{SW3}$, $ODT_{PU}$, and $ODT_{PD}$.

In operation, termination impedance apparatus 400 repetitively and selectively switches between two different modes, alternating between pull-up calibration mode and pull-down calibration mode, as will be more fully described below. During pull-up calibration mode, controller 460 opens switch 456, closes switch 458, and sets switch 454 to have $0.4V_{MEMIO}$ on its second terminal. During pull-down calibration mode, controller 460 closes switch 456, opens switch 458, and sets switch 454 to have $0.6V_{MEMIO}$ on its second terminal.

Figure 5:
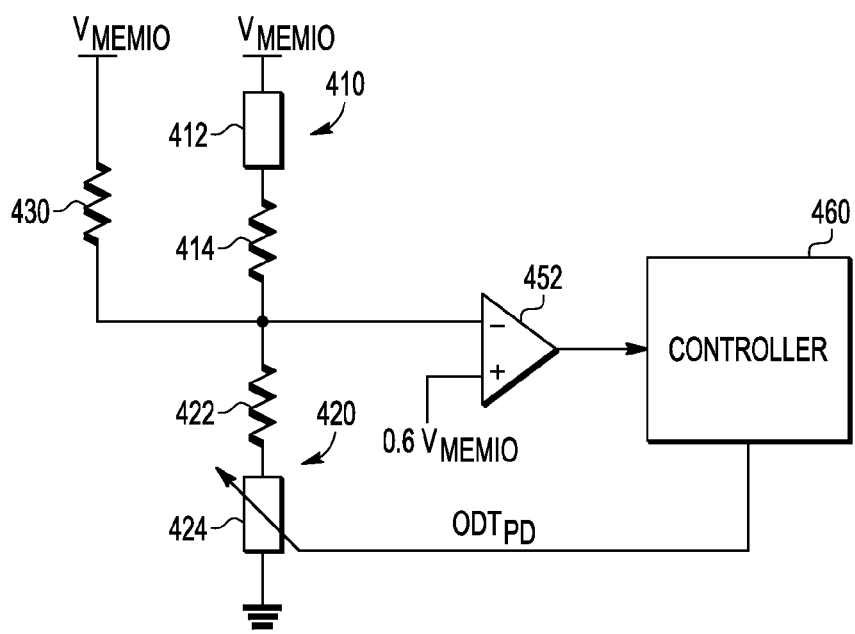
FIG. 5 illustrates in partial block diagram and partial schematic form the termination impedance apparatus of FIG. 4 in a pull-down configuration according to some embodiments.

FIG. 5 illustrates in partial block diagram and partial schematic form termination impedance apparatus 400 of FIG. 4 in a pull-down configuration 500 according to some embodiments. In pull-down configuration 500, switch 454 selects the $0.6V_{MEMIO}$ node, switch 456 is closed, and switch 458 is open. As shown in FIG. 5, variable pull-up resistor 410 includes a set of parallel resistors that are selectively turned on or off, represented here by a transistor 412 and a resistor 414 connected in series between the power supply voltage terminal conducting $V_{MEMIO}$ and the negative input terminal of comparator 452. Variable pull-down resistor 420 also includes a set of parallel resistors that are selectively turned on or off, represented here by resistor 422 and transistor 424 connected in series between the negative input terminal of comparator 452 and ground. In pull-down configuration 500, controller 460 varies $ODT_{PD}$ to transistor 424 until the voltage at the negative input terminal of comparator 452 is approximately equal to $0.6V_{MEMIO}$, while keeping the value of variable pull-up resistor 410 substantially constant. In some embodiments, resistors 410, 420, and 430 can have nominal values of approximately 40 ohms, 60 ohms, or 120 ohms.

Figure 6:
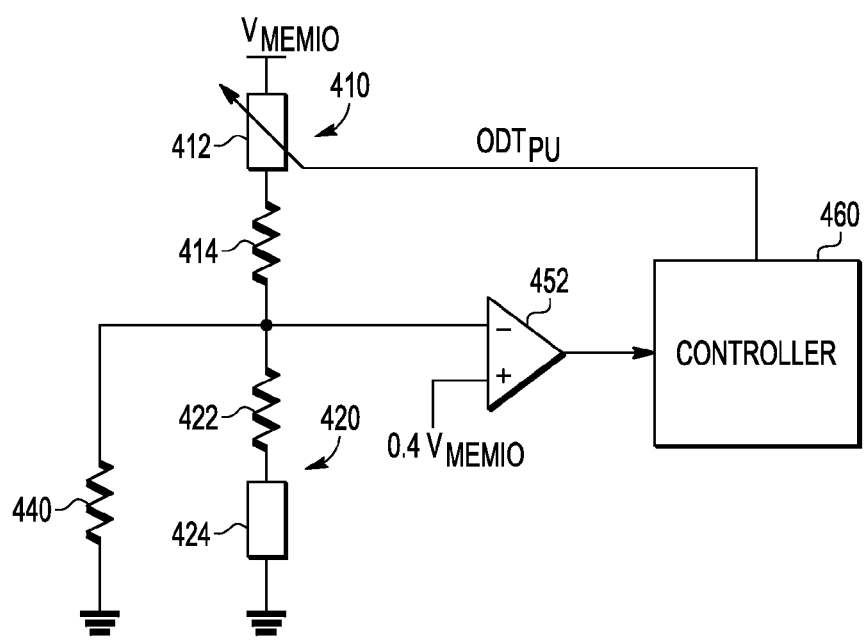
FIG. 6 illustrates in partial block diagram and partial schematic form the termination impedance apparatus of FIG. 4 in a pull-up configuration accordingly to some embodiments.

FIG. 6 illustrates in partial block diagram and partial schematic form termination impedance apparatus 400 of FIG. 4 implementing a pull-up configuration 600 according to some embodiments. When termination impedance apparatus 400 is operating in pull-up configuration 600, switch 454 selects the $0.4V_{MEMIO}$ node, switch 456 is open, and switch 458 is closed. In pull-up configuration 600, controller 460 varies $ODT_{PU}$ to transistor 412 until the voltage at the negative input terminal of comparator 452 is approximately equal to $0.4V_{MEMIO}$, while keeping the value of variable pull-down resistor 420 substantially constant. As will now be explained, during a calibration controller 460 alternates between pull-down configuration 500 and pull-up configuration 600 until the calibration converges to provide better calibration resistances for small-signal conditions than those provided by large signal calibration.

Figure 7:
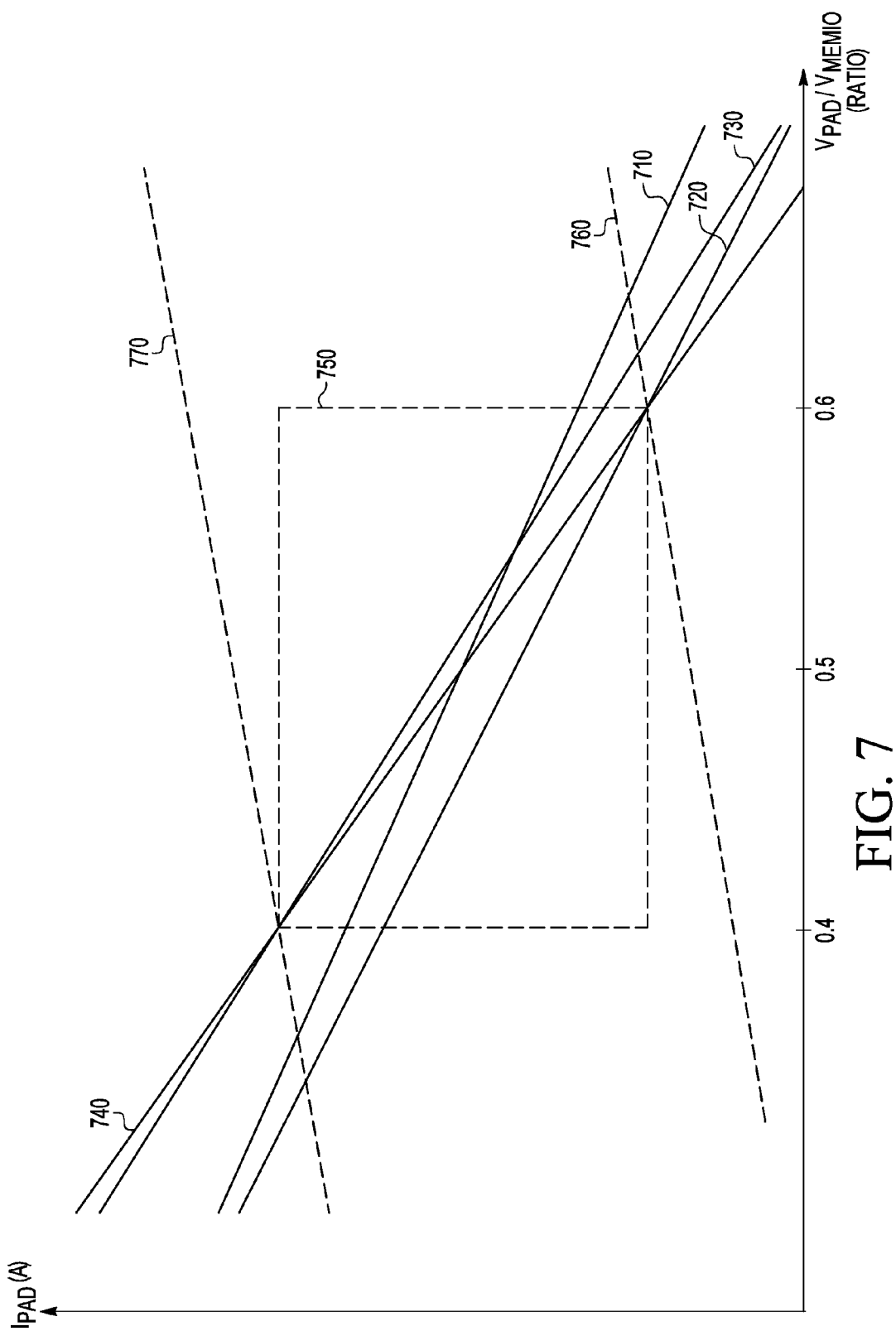
FIG. 7 illustrates a graph showing the variations in on-die termination responses for example iterations of pull-up and pull-down calibration modes according to some embodiments.

FIG. 7 illustrates a graph 700 showing the variations in on-die termination responses for example iterations of pull-up and pull-down calibration modes according to some embodiments. In FIG. 7, the horizontal axis represents the ratio between the voltage at the negative input terminal of comparator 452 labeled "$V_{PAD}$" and $V_{MEMIO}$. The vertical axis represents the current conducted by the resistor being tuned into the load at the negative input terminal of comparator 452, labeled "$I_{PAD}$" in amperes (A). A dashed bounding box 750 represents a range of small-signal voltages, from 0.4 volts to 0.6 volts, and a corresponding desired range of current. A line segment 740 represents an idealized linear small-signal response which intersects the top left and bottom right corners of bounding box 750.

A line segment 710 represents an initial response of termination impedance apparatus 400 after variable pull-up resistor 410 and variable pull-down resistor 420 are large-signal calibrated (using known techniques such as with the use of an external precision resistor) to be substantially equal to a desired Thevenin equivalent impedance for a predetermined reference voltage. Depending upon the specific application, example values for the desired Thevenin impedance may range from approximately 50 ohms to approximately 75 ohms but are preferably approximately 60 ohms. The reference voltage for large signal calibration is set to $V_{MEMIO}/2$, or as shown in FIG. 7, a $V_{PAD/VMEMIO}$ ratio of 0.5. This line segment 710 passes approximately through the center of bounding box 750 but does not intersect the corners at the 0.4 and 0.6 ratios where the ideal line 740 crosses, indicating that the initially calibrated small-signal impedance is much larger than the desired value.

Controller 460 next operates in pull-down configuration 500. Controller 460 provides the value of $ODT_{PU}$ obtained from the large signal calibration, while varying $ODT_{PD}$ until the voltage at the negative input terminal of comparator 452 is such that the $V_{PAD}/V_{MEMIO}$ ratio is approximately equal to 0.6. Thus line segment 710 shifts downward forming line segment 720 that intersects the bottom right corner of bounding box 750.

Controller 460 next operates in pull-up configuration 600. Controller 460 provides the value of $ODT_{PD}$ obtained from the previous operation in pull-down configuration 500, while varying $ODT_{PU}$ until the voltage at the negative input terminal of comparator 452 is such that the $V_{PAD}/V_{MEMIO}$ ratio is approximately equal to 0.4. Thus line segment 720 shifts upward forming line segment 730 that intersects the top left corner of bounding box 750.

Controller 460 repeats this process of shifting between pull-down configuration 500 and pull-up configuration 600 and changing $ODT_{PD}$ and $ODT_{PU}$, respectively, in a ping-pong fashion. Configuration 600 defines a pull-down load line 760. Configuration 500 defines a pull-up load line 770. After a certain number of iterations, when the line segment approximately matches the ideal linearized response illustrated by line segment 740, controller 460 ends the calibration process. As can be seen from FIG. 7, the small-signal calibration (approximately line segment 740) provides much better small-signal termination response than does large signal calibration (line segment 710).

Specific steps within the described termination impedance calibration method may be performed in different order while achieving substantially similar results. For example, in lieu of beginning in pull-down configuration 500, the method may place termination impedance apparatus 400 into pull-up configuration 600 initially after large signal calibration.

Note that FIG. 7 shows load lines 760 and 770 as straight line segments. However since load resistors 430 and 440 also need to be calibrated and also include non-linear switches, load lines 760 and 770 are somewhat curved. However controller 460 still performs accurate small-signal calibration for the pullup and pulldown resistances as long as the curved load lines intersect bounding box 750 at the corners. As will be explained further below, controller 460 calibrates load resistors 430 and 440 to ensure that their slightly curved load lines intersect bounding box 750 at the corners.

Figure 8:
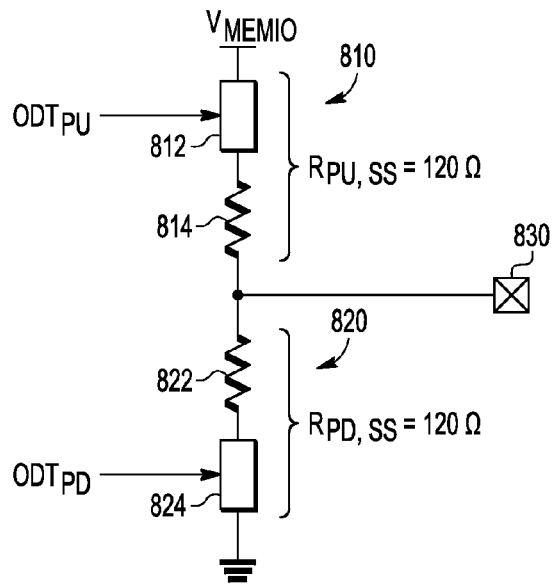
FIG. 8 illustrates in partial block diagram and partial schematic form a termination circuit using resistances calibrated with the termination impedance apparatus of FIG. 4 according to some embodiments.

FIG. 8 illustrates in partial block diagram and partial schematic form a termination circuit 800 having termination resistances calibrated with termination impedance apparatus 400 of FIG. 4 according to some embodiments. Termination circuit 800 includes a variable pull-up termination resistor 810 in series with a variable pull-down termination resistor 820 between $V_{MEMIO}$ and ground. Variable pull-up resistor 810 includes a set of parallel resistors that are selectively turned on or off, represented here by a transistor 812 and a resistor 814 connected in series between the power supply voltage terminal conducting $V_{MEMIO}$ and a bonding pad 830. Variable pull-down resistor 820 includes a set of parallel resistors that are selectively turned on or off, represented here by a resistor 822 and a transistor 824 connected in series between bonding pad 830 and the power supply voltage terminal conducting ground. Transistors 812 and 824 are matched to transistors 412 and 424 in termination impedance apparatus 400, and resistors 814 and 822 are matched to resistors 414 and 422 in termination impedance apparatus 400. Controller 460 provides $ODT_{PU}$ and $ODT_{PD}$ to transistors 812 and 824, respectively, in their active states when on-die termination is required.

Figure 9:
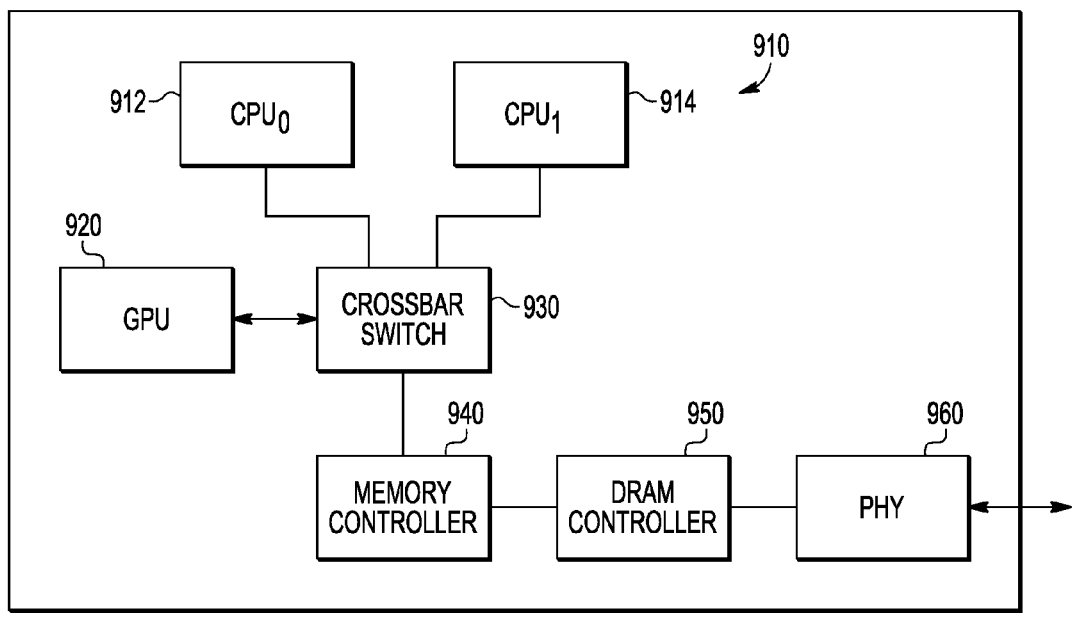
FIG. 9 illustrates in block diagram form an integrated circuit data processor within which the termination impedance apparatus may be advantageously incorporated according to some embodiments.

FIG. 9 illustrates in block diagram form an integrated circuit data processor 900 within which the termination impedance apparatus may be advantageously incorporated according to some embodiments. Generally, integrated circuit data processor 900 includes a set of central processing unit (CPU) cores 910, a graphics processing unit (GPU) 920, a crossbar switch 930, a memory controller 940, a dynamic random access memory (DRAM) controller and a physical layer interface (PHY) 960. CPU cores 910 include a CPU core 912 labeled "CPU0" and a CPU core 914 labeled "CPU$_1$". CPU cores 912 and 914 and GPU 920 are bidirectionally connected to crossbar switch 930 through which they perform memory transactions. Crossbar switch 930 in turn is bidirectionally connected to a memory interface that includes memory controller 940, DRAM controller 950, and PHY 960. PHY 960 is capable of communicating with various types of memory, including DRAMs conforming to double data rate (DDR) versions 2, 3, or 4 (known as DDR2, DDR3, and DDR4). Each of these standards defines a signaling system with a small voltage swing and on-die termination, and in some embodiments PHY 960 includes termination impedance apparatus 400.

Figure 10:
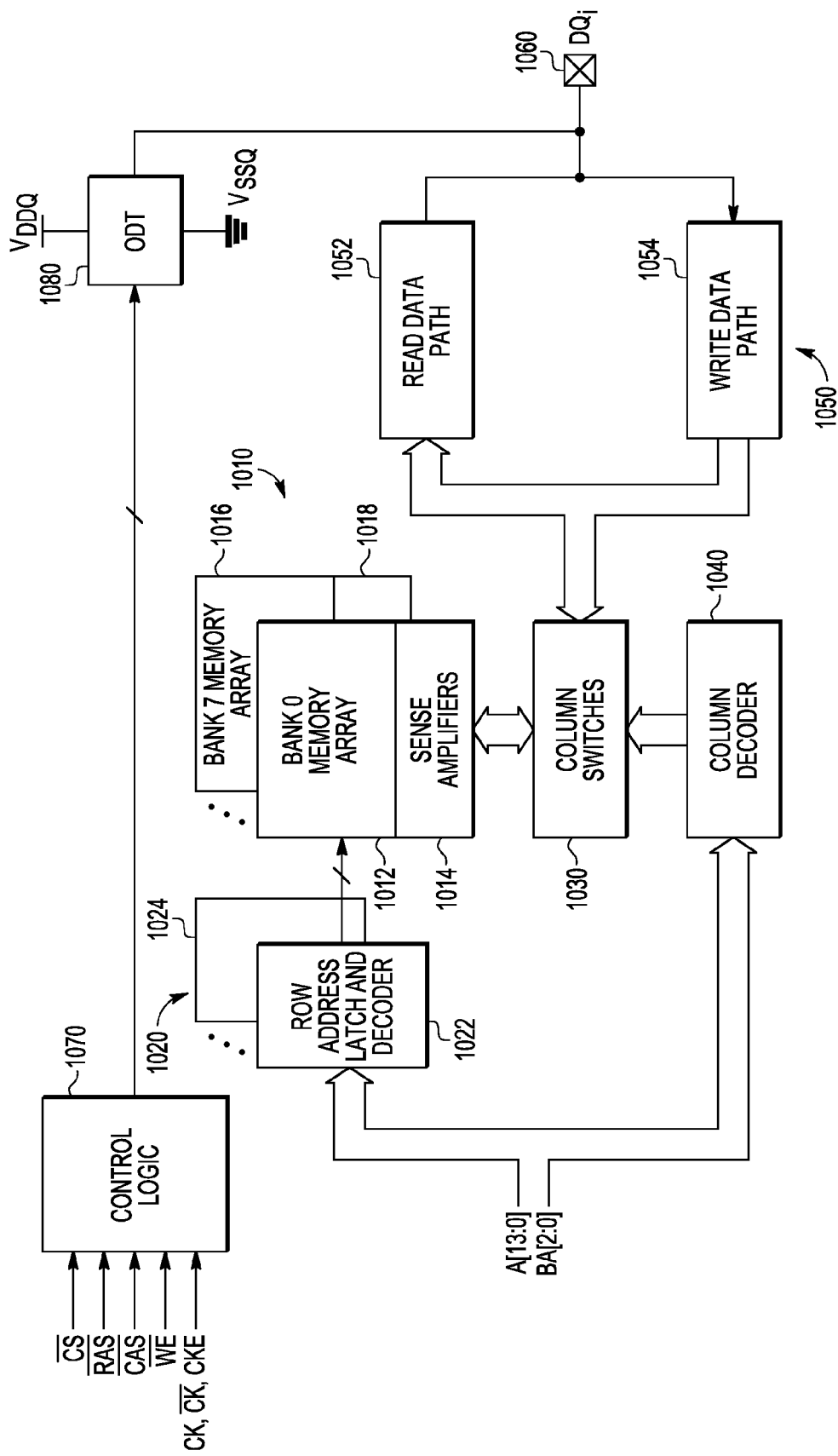
FIG. 10 illustrates in block diagram form an integrated circuit memory within which the termination impedance apparatus may be advantageously incorporated according to some embodiments.

FIG. 10 illustrates in block diagram form an integrated circuit memory 1000 within which the termination impedance apparatus may be advantageously incorporated according to some embodiments. Integrated circuit memory 1000 includes a set of memory banks 1010, a row path 1020, a set of column switches 1030, a column decoder 1040, a data path 1050, a data pad 1060, a control logic circuit 1070, and an on-die termination (ODT) circuit 1080.

Set of memory banks 1010 includes eight memory banks including a first memory bank designated "BANK0" having an associated memory array 1012 and a set of sense amplifiers 1014, and a last memory bank designated "BANK7" having an associated memory array 1016 and a set of sense amplifiers 1018.

Row path 1020 has inputs for receiving a row address on address pins such as example row address pins labeled "A[13:0]", and a bank address labeled "BA[2:0]" for selecting one of the eight banks. Row path 1020 includes for each bank a row address latch and decoder such as an example row address latch and decoder 1022 for BANK0 and an example row address latch and decoder 1024 for BANK7, each receiving the row address and activating one of a set of word lines to its corresponding bank's memory array when selected.

Column decoder 1040 has an input for receiving a column address on A[13:0] and a set of outputs for selecting switches in column switches 1030. Each column switch in column switches 1030 is connected between a selected column and a data output line.

Data path 1050 includes a read data path 1052 and a write data path 1054. Read data path 1052 has an input connected to a data terminal of column switches 1030, and an output connected to a set data pads the number of which depends on the size of integrated circuit memory 1000, such as eight or sixteen. FIG. 10 illustrates a representative one of a set of data pads 1060 labeled "DQ$_i$". Write data path 1054 has an input connected to the set of data pads, and an output connected to the data terminal of column switches 1030.

Control logic 1070 is responsible for the control and timing of various operations and modes in integrated circuit memory 1000, and receives a set of command input signals labeled "$\overline{CS}$", "$\overline{RAS}$", "$\overline{CAS}$" and "$\overline{WE}$", as well as a differential clock received on signals labeled "CK" and "$\overline{CK}$", and a clock enable signal labeled "CKE". Control logic 1070 is used to implement the set of commands and modes for the type of DRAM. For example, if integrated circuit memory 1000 implements the DDR4 standard, it would operate according to the command truth table defined in the DDR4 standard. In particular, control logic 1070 decodes commands for which on-die termination is needed. For example during a read mode in which integrated circuit memory 1000 will drive data values on the data pads, on-die termination is not enabled, whereas during a cycle in which integrated circuit memory 1000 is not selected, control logic 1070 enables on-die termination to support the SSTL signaling environment. In some embodiments, control logic 1070 includes a calibration circuit like calibration circuit 400 of FIG. 4, and ODT circuit 1080 includes a termination circuit like termination circuit 800 of FIG. 8 for data pad 1060. Note that for integrated circuit memory 1000, $V_{DDQ}$ is an input/output power supply voltage and corresponds to $V_{MEMIO}$.

Figure 11:
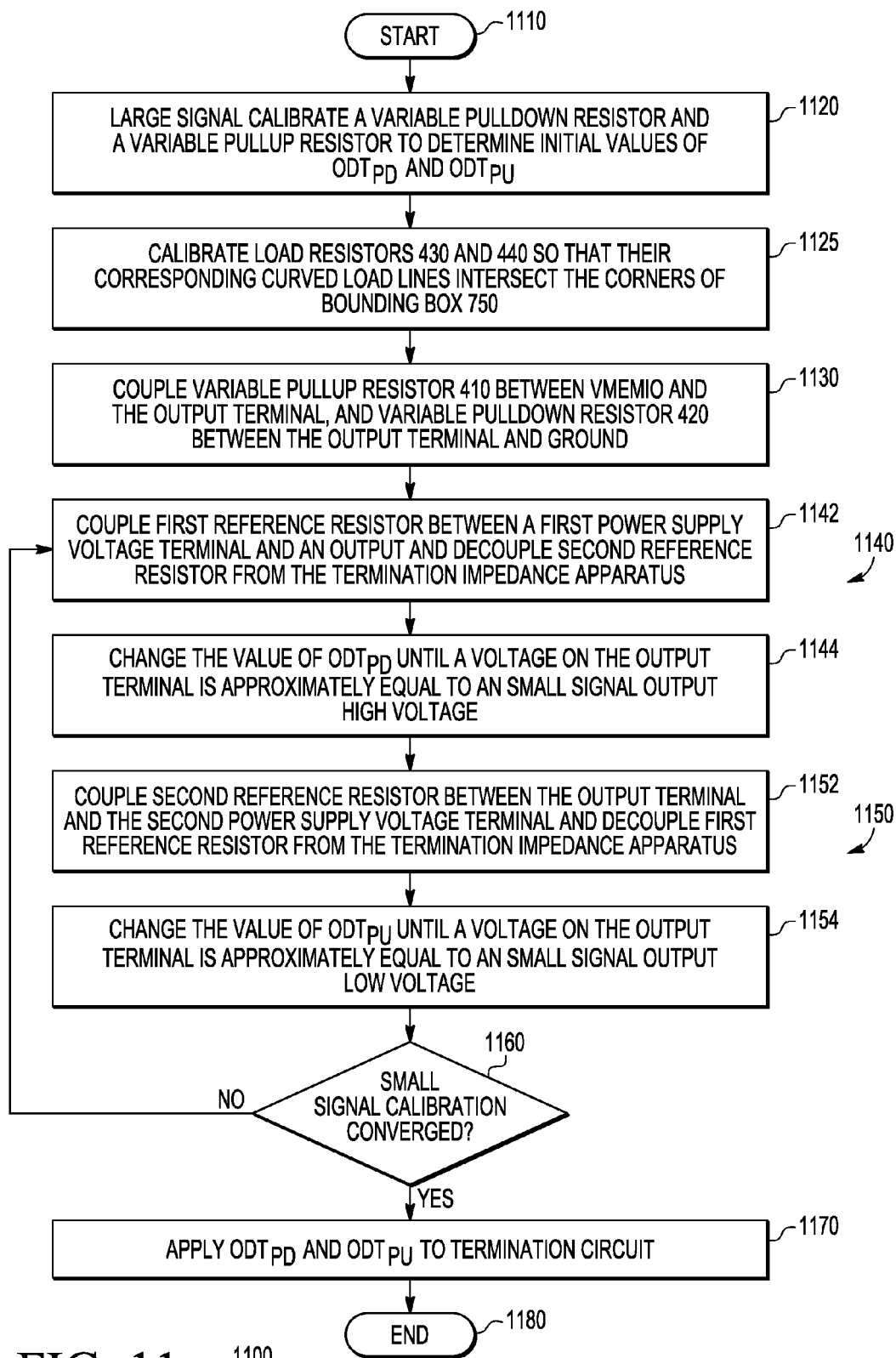
FIG. 11 illustrates a method for performing small-signal calibration according to some embodiments.

FIG. 11 illustrates a method 1100 for performing small-signal calibration according to some embodiments. Method 1100 starts at a box 1110. With reference to corresponding elements in the example small-signal calibration of FIGS. 4-8, in an action box 1120, variable pull-down resistor 420 and a variable pull-up resistor 410 are large signal calibrated to determine initial values of $ODT_{PD}$ and $ODT_{PU}$. In an action box 1125, load resistors 430 and 440 are calibrated so that their corresponding curved load lines intersect the corners of bounding box 750. More specifically, controller 460 calibrates the resistance of reference resistor 430 to conduct a low current at the output high voltage. Likewise, controller 460 calibrates the resistance of reference resistor 440 to conduct a high current at the output low voltage. In an action box 1130, variable pull-up resistor 410 is coupled between $V_{MEMIO}$ and the output terminal, and variable pull-down resistor 420 is coupled between the output terminal and ground. A set of action boxes 1140 including action boxes 1142 and 1144 corresponds to calibration using pull-down configuration 500. In action box 1142, reference resistor 430 is coupled between a first power supply voltage terminal ($V_{MEMIO}$) and an output terminal, and reference resistor 440 is decoupled from termination impedance apparatus 400. In action box 1144, the value of $ODT_{PD}$ is changed until a voltage on the output terminal is approximately equal to the small-signal output high voltage ($0.6V_{MEMIO}$). A set of action boxes 1150 including action boxes 1152 and 1154 corresponds to calibration using pull-up configuration 600. In action box 1152, reference resistor 440 is coupled between the output terminal and a second power supply voltage terminal (ground) and reference resistor 430 is decoupled from termination impedance apparatus 400. In action box 1154, the value of $ODT_{PU}$ is changed until a voltage on the output terminal is approximately equal to the small-signal output low voltage ($0.4V_{MEMIO}$). A decision box 1160 determines whether method 1100 has converged. If not, then the flow returns to action box 1142. If so, then the flow proceeds to an action box 1170, which applies $ODT_{PD}$ and $ODT_{PU}$ to termination circuit 800. Method 1100 ends in box 1180.

The calibration circuit described above may be implemented with various combinations of hardware and software. Some of the software components may be stored in a computer readable storage medium for execution by at least one processor. Moreover the method illustrated in FIG. 11 may also be governed by instructions that are stored in a computer readable storage medium and that are executed by at least one processor. Each of the operations shown in FIG. 11 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Hardware variations include using internal or external resistors for load resistors 430 and 440, which may consist of linear or non-linear elements. Internal load resistors may in fact come from additional on-die placements of resistor elements like resistors 410 and 420 that have been calibrated against an external resistor to exhibit the desired load line characteristics 760 and 770. Although variable pull-up resistor 410 and variable pull-down resistor 420 may therefore be non-linear, their non-linearity does not alter the overall operation if they have been calibrated to cross at the upper left and lower right corners of bounding box 750 in FIG. 7.

Moreover, the circuits illustrated above, or integrated circuits these circuits such as integrated circuit data processor 900 or integrated circuit memory 1000, may be described or represented by a computer accessible data structure in the form of a database or other data structure which can be read by a program and used, directly or indirectly, to fabricate integrated circuits with the circuits described above. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, modification of these embodiments will be apparent to one of ordinary skill in the art. For example integrated circuit data processor 900 could be formed by a variety of elements including additional central processing units, one or more Digital Signal Processing (DSP) units, additional memory controllers and PHY interfaces and the like. Integrated circuit data processor 900 may also be a dedicated memory controller wherein the PHY interface utilizes termination impedance apparatus 400 in the disclosed manner. Integrated circuit memory 1000 could be a dynamic random memory (DRAM), such as a double data rate (DDR) DRAM, or other type of memory.

Accordingly, it is intended by the appended claims to cover all modifications of the disclosed embodiments that fall within the scope of the disclosed embodiments.

What is claimed is:

1. A termination impedance apparatus comprising:
   a variable pull-up resistor coupled between a first power supply voltage terminal and an output terminal;
   a variable pull-down resistor coupled between said output terminal and a second power supply voltage terminal; and
   a small-signal calibration circuit for alternately calibrating said variable pull-up resistor and said variable pull-down resistor to achieve a desired small-signal voltage swing.

2. The termination impedance apparatus of claim 1, wherein said small-signal calibration circuit comprises:
   a first reference resistor;
   a second reference resistor; and
   a control circuit for coupling said first reference resistor between said first power supply voltage terminal and said output terminal and changing a resistance of said variable pull-down resistor until a voltage on said output terminal is approximately equal to an output high voltage in a pull-down calibration mode, and for coupling said second reference resistor between said output terminal and said second power supply voltage terminal and changing a resistance of said variable pull-up resistor until a voltage on said output terminal is approximately equal to an output low voltage in a pull-up calibration mode.

3. The termination impedance apparatus of claim 2 wherein said variable pull-up resistor and said variable pull-down resistor are characterized as being non-linear resistors.

4. The termination impedance apparatus of claim 3 wherein said first reference resistor and said second reference resistor are characterized as being non-linear resistors.

5. The termination impedance apparatus of claim 2, wherein said control circuit comprises:
   a comparator having a first input coupled to said output terminal, a second input, and an output; and
   a first switch having a first terminal coupled to said second input of said comparator, a second terminal for receiving said output high voltage, a third terminal for receiving said output low voltage, and a control terminal; and
   a controller having an input coupled to said output of said comparator, and an output coupled to said control terminal of said first switch.

6. The termination impedance apparatus of claim 5, wherein said control circuit further comprises:
   a second switch having a first terminal coupled to a terminal of said first reference resistor, a second terminal coupled to said output terminal, and a control terminal; and
   a third switch having a first terminal coupled to a terminal of said reference resistor, a second terminal coupled to said output terminal, and a control terminal,
   wherein said controller further has output terminals coupled to said control terminals of said second and third switches.

7. The termination impedance apparatus of claim 2, wherein said control circuit repetitively operates in said pull-down calibration mode and said pull-up calibration mode until said voltage on said output terminal is approximately equal to said output high voltage in said pull-down calibration mode and said voltage on said output terminal is approximately equal to said output low voltage in said pull-up calibration mode without changing said resistances of said variable pull-up resistor and said variable pull-down resistor.

8. The termination impedance apparatus of claim 1 wherein said variable pull-up resistor and said variable pull-down resistor are active in a normal operation mode in response to an on-die termination control signal.

9. A system comprising:
   a bus circuit capable of providing data to or receiving data from an external bus;
   a termination impedance apparatus coupled to said bus circuit and comprising:
      a variable pull-up resistor coupled between a first power supply voltage terminal and an output terminal;

a variable pull-down resistor coupled between said output terminal and a second power supply voltage terminal; and a small-signal calibration circuit for alternately calibrating said variable pull-up resistor and said variable pull-down resistor to achieve a desired small-signal voltage swing.

10. The system of claim 9, further comprising said external bus.

11. The system of claim 10, wherein said bus circuit is a physical interface for a dynamic random access memory (DRAM) controller, and the system further comprises a DRAM coupled to said DRAM controller over said external bus.

12. The system of claim 10 wherein said bus circuit is a data input/output circuit for a dynamic random access memory (DRAM), and the system further comprises a DRAM controller having a physical interfacde coupled to said DRAM over said external bus.

13. The system of claim 9, wherein said small-signal calibration circuit comprises:
a first reference resistor;
a second reference resistor; and
a control circuit for coupling said first reference resistor between said first power supply voltage terminal and said output terminal and changing a resistance of said variable pull-down resistor until a voltage on said output terminal is approximately equal to an output high voltage in a pull-down calibration mode, and for coupling said second reference resistor between said output terminal and said second power supply voltage terminal and changing a resistance of said variable pull-up resistor until a voltage on said output terminal is approximately equal to an output low voltage in a pull-up calibration mode.

14. The system of claim 13, wherein said variable pull-up resistor and said variable pull-down resistor are characterized as being non-linear resistors.

15. The system of claim 14, wherein said first reference resistor and said second reference resistor are characterized as being non-linear resistors.

16. The system of claim 13, wherein said control circuit comprises:
a comparator having a first input coupled to said output terminal, a second input, and an output; and
a first switch having a first terminal coupled to said second input of said comparator, a second terminal for receiving said output high voltage, a third terminal for receiving said output low voltage, and a control terminal; and
a controller having an input coupled to said output of said comparator, and an output coupled to said control terminal of said first switch.

17. The system of claim 16, wherein said control circuit further comprises:
a second switch having a first terminal coupled to a terminal of said first reference resistor, a second terminal coupled to said output terminal, and a control terminal; and
a third switch having a first terminal coupled to a terminal of said reference resistor, a second terminal coupled to said output terminal, and a control terminal,
wherein said controller further has output terminals coupled to said control terminals of said second and third switches.

18. The system of claim 13, wherein said control circuit repetitively operates in said pull-down calibration mode and said pull-up calibration mode until said voltage on said output terminal is approximately equal to said output high voltage in said pull-down calibration mode and said voltage on said output terminal is approximately equal to said output low voltage in said pull-up calibration mode without changing said resistances of said variable pull-up resistor and said variable pull-down resistor.

19. The system of claim 13, wherein said bus circuit, said variable pull-up resistor, said variable pull-down resistor, and said small-signal calibration circuit are combined on a single integrated circuit.

20. The system of claim 9, wherein said variable pull-up resistor and said variable pull-down resistor are active in a normal operation mode in response to an on-die termination control signal.

21. A method comprising:
coupling a variable pull-up resistor between a first power supply voltage terminal and an output terminal;
coupling a variable pull-down resistor between said output terminal and a second power supply voltage terminal;
coupling a first reference resistor between said first power supply voltage terminal and said output terminal; and
changing a value of said variable pull-down resistor until a voltage on said output terminal falls below an output high voltage of a small-signal voltage swing in a pull-down configuration.

22. The method of claim 21 further comprising:
decoupling said first reference resistor from said output terminal;
coupling a second reference resistor between said output terminal and said second power supply voltage terminal; and
changing a value of said variable pull-up resistor until a voltage of an output terminal rises above an output low voltage of said small-signal voltage swing in a pull-up configuration.

23. The method of claim 22 further comprising:
repeating said coupling said first reference resistor between said first power supply voltage terminal and said output terminal, said changing said value of said variable pull-down resistor, said decoupling, said coupling said second reference resistor between said output terminal and said first power supply voltage terminal, and said changing a value of said variable pull-up resistor until said voltage on said output terminal is both approximately equal to said output low voltage in said pull-down configuration and approximately equal to said output high voltage in said pull-up configuration.

24. The method of claim 21 further comprising:
large-signal calibrating a resistance of said variable pull-up resistor and a resistance of said variable pull-down resistor to be substantially equal to a reference value plus a predetermined amount.

25. The method of claim 21 further comprising:
calibrating a resistance of said first reference resistor to conduct a predetermined current at said output high voltage.

26. A method comprising:
coupling a variable pull-up resistor between a first power supply voltage terminal and an output terminal;
coupling a variable pull-down resistor between said output terminal and a second power supply voltage terminal;
coupling a first reference resistor between said output terminal and said second power supply voltage terminal; and changing a value of said variable pull-up resistor until a voltage on said output terminal rises above an output low voltage of a small-signal voltage swing in a pull-up configuration.

27. The method of claim 26 further comprising:

decoupling said first reference resistor from said output terminal;

coupling a second reference resistor between said first power supply voltage terminal and said output terminal; and changing a value of said variable pull-down resistor until a voltage of an output terminal falls below an output high voltage of said small-signal voltage swing in a pull-down configuration.

28. The method of claim 27 further comprising:

repeating said coupling said first reference resistor, said changing said value of said variable pull-up resistor, said decoupling, said coupling said second reference resistor, and said changing said value of said variable pull-down resistor until said voltage on said output terminal is both approximately equal to said output low voltage in said pull-down configuration and approximately equal to said output high voltage in said pull-up configuration.

29. The method of claim 26 further comprising:

large-signal calibrating a resistance of said variable pull-up resistor and a resistance of said variable pull-down resistor to be substantially equal to a reference value plus a predetermined amount.

30. The method of claim 26 further comprising:

calibrating a resistance of said first reference resistor to conduct a predetermined current at said output low voltage.

* * * * *